(12) United States Patent
Di et al.

(10) Patent No.: US 9,230,849 B2
(45) Date of Patent: Jan. 5, 2016

(54) METHOD FOR PREPARING ULTRA-THIN MATERIAL ON INSULATOR THROUGH ADSORPTION BY DOPED ULTRA-THIN LAYER

(71) Applicants: Zengfeng Di, Shanghai (CN); Da Chen, Shanghai (CN); Jiantao Bian, Shanghai (CN); Zhongying Xue, Shanghai (CN); Miao Zhang, Shanghai (CN)

(72) Inventors: Zengfeng Di, Shanghai (CN); Da Chen, Shanghai (CN); Jiantao Bian, Shanghai (CN); Zhongying Xue, Shanghai (CN); Miao Zhang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 13/825,079

(22) PCT Filed: Sep. 25, 2012

(86) PCT No.: PCT/CN2012/081894
§ 371 (c)(1),
(2) Date: Mar. 19, 2013

(87) PCT Pub. No.: WO2014/032346
PCT Pub. Date: Mar. 6, 2014

(65) Prior Publication Data
US 2015/0194338 A1 Jul. 9, 2015

(30) Foreign Application Priority Data
Aug. 28, 2012 (CN) .......................... 2012 1 0310581

(51) Int. Cl.
*H01L 21/30* (2006.01)
*H01L 21/762* (2006.01)
*H01L 21/306* (2006.01)

(52) U.S. Cl.
CPC .... *H01L 21/76254* (2013.01); *H01L 21/30604* (2013.01); *H01L 21/30625* (2013.01)

(58) Field of Classification Search
CPC .................... H01L 21/76254; H01L 21/30625
USPC .................................................. 438/455, 458
See application file for complete search history.

(56) References Cited

U.S. PATENT DOCUMENTS

| 4,939,101 A | * | 7/1990 | Black et al. | .................... 438/455 |
| 2006/0076664 A1 | * | 4/2006 | Chen et al. | .................... 257/686 |
| 2006/0270190 A1 | * | 11/2006 | Nastasi et al. | ................ 438/458 |

FOREIGN PATENT DOCUMENTS

| CN | 1684243 A | 10/2005 |
| CN | 102347267 A | 2/2012 |

OTHER PUBLICATIONS

International Preliminary Examination Report (PCT).

*Primary Examiner* — Bradley K Smith
(74) *Attorney, Agent, or Firm* — Global IP Services; Tianhua Gu

(57) ABSTRACT

The present invention provides a method for preparing an ultra-thin material on insulator through adsorption by a doped ultra-thin layer. In the method, first, an ultra-thin doped single crystal film and an ultra-thin top film (or contains a buffer layer) are successively and epitaxially grown on a first substrate, and then a high-quality ultra-thin material on insulator is prepared through ion implantation and a bonding process. A thickness of the prepared ultra-thin material on insulator ranges from 5 nm to 50 nm. In the present invention, the ultra-thin doped single crystal film adsorbs the implanted ion, and a micro crack is then formed, so as to implement ion-cut; therefore, the roughness of a surface of a ion-cut material on insulator is small. In addition, an impurity atom strengthens an ion adsorption capability of the ultra-thin single crystal film, so that an ion implantation dose and the annealing temperature can be lowered in the preparation procedure, thereby effectively reducing the damage caused by the implantation to the top film, and achieving objectives of improving production efficiency and reducing the production cost.

16 Claims, 3 Drawing Sheets

METHOD FOR PREPARING ULTRA-THIN MATERIAL ON INSULATOR THROUGH ADSORPTION BY DOPED ULTRA-THIN LAYER

CROSS REFERENCE TO RELATED PATENT APPLICATION

The present application is the US national stage of PCT/CN2012/081894filed on Sep. 25, 2012, which claims the priority of the Chinese patent application No. 201210310581.X filed on Aug. 28, 2012, which application is incorporated herein by reference.

BACKGROUND OF THE PRESENT INVENTION

1. Field of Invention

The present invention relates to the technical field of microelectronics and solid state electronics, and specifically to a method for preparing an ultra-thin material on insulator through adsorption by a doped ultra-thin layer.

2. Description of Related Arts

In recent years, a silicon on insulator (SOI) material is capable of reducing, through a unique insulating buried layer structure thereof, a parasitic capacitance and a leakage current of a substrate, and is widely applied in various fields such as low-voltage, low-power-consumption, high-temperature, and radiation-resistant devices. SOI application technologies have been very mature in relevant fields, and strained silicon on insulator (sSOI) has also caught increasing attention of relevant technical personnel. Silicon germanium on insulator (SGOI) combines advantages of a silicon germanium material and the SOI, which can not only reduce a parasitic capacitance and a leakage current of a substrate, but also increase carriers' mobilities. The SGOI has also caught wide attention. To prepare a device having a smaller size and higher performance has always been an objective and an orientation in the development of the semiconductor industry, and with the very large scale integrated circuit technology achieving a level of a node of 22 nm and beyond, a higher requirement for a feature size of an integrated circuit is proposed. To further miniaturize a device based on a material on insulator, the thickness of the material on insulator is required to be thinner; therefore, an ultra-thin material on insulator emerges as the time requires.

Generally, a material on insulator is obtained by two procedures: material preparation and layer transfer, and the most common technology for implementing the layer transfer is bonding and ion-cut processes. However, in a conventional smart-cut method, a transfer layer is rather thick and the crack is large, a surface of a material on insulator obtained after ion-cut is rather rough, so it is difficult to prepare an ultra-thin material on insulator; moreover, because a rather high implantation dose is required, not only the production time and cost are increased, but also great damage is caused to the crystal, so it is more difficult to prepare a high-quality ultra-thin material on insulator.

Therefore, how to provide a method for preparing a high-quality ultra-thin material on insulator at low cost has already been a technical problem to be solved by practitioners in the art.

SUMMARY OF THE PRESENT INVENTION

In view of the above defects in the prior art, an objective of the present invention is to provide a method for preparing an ultra-thin material on insulator through adsorption by a doped ultra-thin layer, so as to solve the problem in the prior art that it is difficult to prepare a high-quality ultra-thin material on insulator.

To accomplish the above objective and other relevant objectives, the present invention provides a method for preparing an ultra-thin material on insulator through adsorption by a doped ultra-thin layer, wherein the preparation method comprises at least the following steps:

a) providing a first substrate, and successively and epitaxially growing a doped single crystal film and a top film on the first substrate;

b) performing ion implantation, and making the ion implanted into a preset depth under an interface between the doped single crystal film and a silicon substrate;

c) providing a second substrate having an insulating layer, bonding the insulating layer and the top film, and then performing a first annealing stage on a sample to make the doped single crystal film adsorb the ion and form a micro crack, so as to implement ion-cut; and d) performing chemical etch or chemical-mechanical polishing, and removing the residual doped single crystal film, so as to obtain an ultra-thin material on insulator.

Optionally, in Step a), a step of epitaxially growing a buffer layer on the doped single crystal film is further comprised; and in Step d), a step of removing a residual buffer layer and doped single crystal film is further comprised.

Optionally, a material of the buffer layer is selected from any one of Si, Ge, SiGe, SiGeC, GaAs, AlGaAs, InGaP, and InP.

Optionally, the thickness of the buffer layer does not exceed a critical thickness of the buffer layer growing on the doped single crystal film.

Optionally, in Step a), the doped single crystal film is a single-layer film, a material of the single-layer film is selected from any one of Si, Ge, SiGe, SiGeC, GaAs, AlGaAs, InGaP, and InP, and doped gas is introduced at the same time when the single-layer film is grown, so as to form a single-layer doped single crystal film.

Optionally, the thickness of the single-layer doped single crystal film ranges from 3 nm to 10 nm.

Optionally, in Step a), the doped single crystal film is a multi-layer film, wherein the multi-layer film is formed by multiple superposed bi-layer films, a material of the bi-layer films is selected from any one of Si/Ge, Si/SiGe, Ge/SiGe, Ge/GaAs, GaAs/AlGaAs, and InP/InGa, and doped gas is introduced at the same time when the multi-layer film is grown, so as to form a multi-layer doped single crystal film.

Optionally, the total thickness of the multi-layer doped single crystal film is less than 10 nm.

Optionally, in the doped single crystal film, an impurity element is B, P, Ga, As, Sb, In, or C.

Optionally, in the doped single crystal film, the concentration of the doping ions ranges from 1E19 $cm^{-3}$ to 1E22 $cm^{-3}$.

Optionally, a material of the top film is selected from any one of Si, Ge, SiGe, SiGeC, GaAs, AlGaAs, InGaP and InP.

Optionally, the thickness of the top film ranges from 5 nm to 50 nm.

Optionally, in Step b), an H ion is implanted, or an H ion and a He ion are implanted together.

Optionally, in Step b), an ion implantation dose ranges from 3E16 $cm^{-2}$ to 6E16 $cm^{-2}$.

Optionally, in Step b), the preset depth ranges from 30 nm to 120 nm.

Optionally, in Step c), the bonding adopts a plasma enhanced bonding method.

Optionally, in Step c), the bonding adopts a direct bonding method, and a step of performing a second annealing stage after the ion-cut implemented in the first annealing stage is further comprised, so as to strengthen the bonding of the insulating layer and the top film.

As mentioned above, in the present invention, the method for preparing the ultra-thin material on insulator through the adsorption by the doped ultra-thin layer has the following beneficial effects: the ultra-thin doped single crystal film adsorbs the implanted ion, and the micro crack is then formed, so as to implement the ion-cut; the ion-cut crack emerges on the ultra-thin layer, and the crack is rather small; therefore, the roughness of a surface of a ion-cut material on insulator is small; the ion is effectively adsorbed by the ultra-thin layer and the distribution is more even, so that an obtained material on insulator or a modified material on insulator has fewer defects; in addition, the impurity strengthens an ion adsorption capability of the ultra-thin single crystal film, so that the ion implantation dose can be lowered, and the annealing temperature of the ion-cut can also be lowered, thereby effectively reducing the damage to the material on insulator, reducing the cost, and then achieving the objective of preparing a high-quality ultra-thin material on insulator.

DESCRIPTION OF THE REFERENCE NUMERALS

Figure 1:
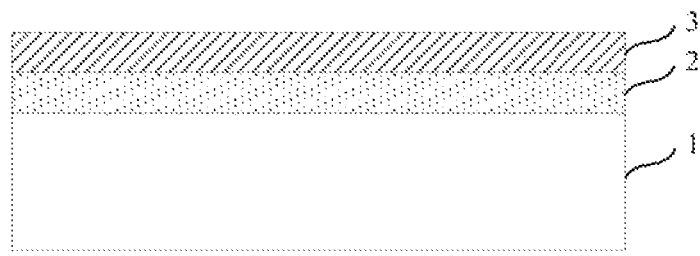
FIG. 1 is a schematic structural diagram presented in Step 1 of a method for preparing an ultra-thin material on insulator through adsorption by a doped ultra-thin layer according to Embodiment 1 of the present invention.

1 First substrate
211 Si layer
212 $Si_{1-x}Ge_x$ Layer
21-24 $Si/Si_{1-x}Ge_x$ bi-layer film
2 Doped single crystal film
3 Top film
4 Second substrate
5 Insulating layer

DETAILED DESCRIPTION OF THE PREFERRED EMBODIMENTS

Implementation manners of the present invention are illustrated below with particular and specific examples, and persons skilled in the art can easily understand other advantages and efficacy of the present invention from the content disclosed in the specification. The present invention can further be implemented or applied through other different specific implementation manners, details in the present specification can also be based on different opinions and applications, and various modifications or changes can be made without departing from the spirit of the present invention.

Referring to FIG. 1 to FIG. 11, it should be noted that, figures provided in the embodiments only describe the basic idea of the present invention in a schematic manner; components relevant to the present invention are only shown in the figures rather than the number, shape, and size of components required in practical implementation; and the type, number, and ratio of each component in practical implementation can be changed randomly, and the layout type of the components may be more complex.

Embodiment 1

As shown in FIG. 1 to FIG. 6, the present invention provides a method for preparing an ultra-thin material on insulator through adsorption by a doped ultra-thin layer, where the method includes at least the following steps:

Step 1: Referring to FIG. 1 and as shown in the figure, provide a first substrate 1, adopt a chemical vapor deposition method, a physical vapor deposition method, or a molecular beam epitaxy method to successively and epitaxially grow a single-layer doped single crystal film 2 and a top film 3 on the first substrate 1. Specifically, in the single-layer doped single crystal film 2, a material of the single crystal film is Si, Ge, SiGe, SiGeC, GaAs, AlGaAs, InGaP, or InP, where a constituent of Ge in SiGe is adjustable; an impurity element is B, P, Ga, As, Sb, In, or C; the concentration of the impurity ranges from 1E19 to 1E22; the thickness of the single-layer doped single crystal film 2 ranges from 3 nm to 10 nm; a material of the top film 3 is Si, Ge, SiGe, SiGeC, GaAs, AlGaAs, InGaP, or InP; a constituent of Ge in SiGe is adjustable; and the thickness of the top film 3 ranges from 5 nm to 50 nm. In this embodiment, the first substrate 1 is made of, but is not limited to, Si; the material of the single crystal film is preferably SiGe, where a ratio of Ge to Si is preferably 3:7; the impurity element is preferably B; the concentration of the impurity is preferably 2E19 cm$^{-3}$; and the top film 3 is preferably made of Si, and the thickness thereof is preferably 10 nm.

Figure 2:
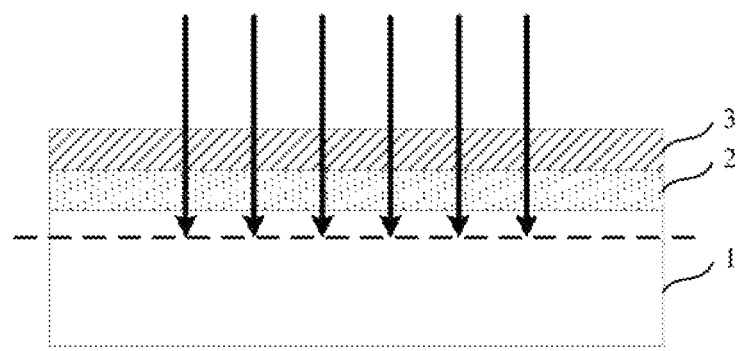
FIG. 2 is a schematic diagram showing ion implantation in Step 2 of a method for preparing an ultra-thin material on insulator through adsorption by a doped ultra-thin layer according to Embodiment 1 of the present invention.

Step 2: Referring to FIG. 2 and as shown in the figure, perform ion implantation from a specific energy and angle (which belongs to common knowledge in the field, and is not elaborated herein), make the ion implanted into a depth of 30 nm to 120 nm under an interface between the doped single crystal film 2 and the first substrate 1. Specifically, an H ion is implanted, or an H ion and a He ion are implanted together, and an ion implantation dose ranges from 3E16 cm$^{-2}$ to 6E16 cm$^{-2}$. In this embodiment, the implanted ion is preferably the H ion, the implantation depth is 30 nm under the interface between the doped single crystal film 2 and the first substrate 1; and the implantation dose is 3E16 cm$^{-2}$.

Figure 3:
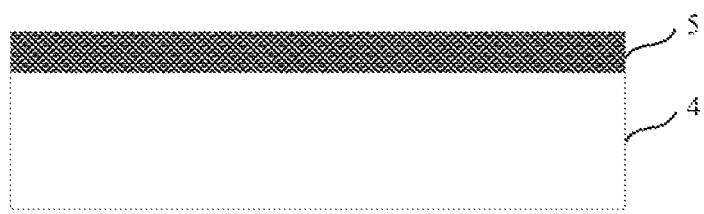
FIG. 3 is a schematic diagram of a second substrate having an insulating layer in Step 3 of a method for preparing an ultra-thin material on insulator through adsorption by a doped ultra-thin layer according to Embodiment 1 of the present invention.
Figure 4:
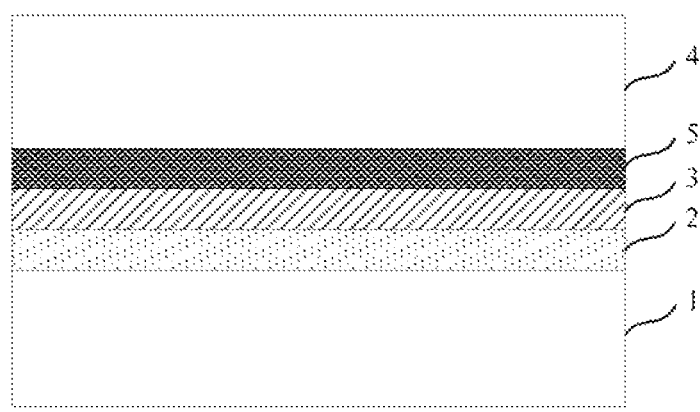
FIG. 4 is a schematic structural diagram presented after bonding in Step 3 of a method for preparing an ultra-thin material on insulator through adsorption by a doped ultra-thin layer according to Embodiment 1 of the present invention.

Step 3: Referring to FIG. 3 and FIG. 4 and as shown in the figures, provide a second substrate 4 having an insulating layer 5, bond the insulating layer 5 and the top film 3, and then perform a first annealing stage on a sample to make the doped single crystal film adsorb the implanted ion from the first substrate 1 and form a micro crack, so as to implement ion-cut. Specifically, the bonding adopts a plasma enhanced bonding method or a direct bonding method. When the direct bonding method is adopted, a second annealing stage further needs to be performed after the first annealing stage, so as to strengthen the bonding of the insulating layer 5 and the top film 3. In the first annealing stage, the annealing temperature ranges from 300° C. to 600° C., and the annealing duration ranges from 30 to 90 minutes; while in the second annealing stage, the annealing temperature ranges from 800° C. to 1,000° C., and the annealing duration ranges from 60 to 120 minutes. In this embodiment, the bonding method is preferably the plasma enhanced bonding method, that is, the second annealing stage is not required to strengthen the bonding, so as to avoid that high-temperature anneal affects the quality of the top film.

Figure 5:
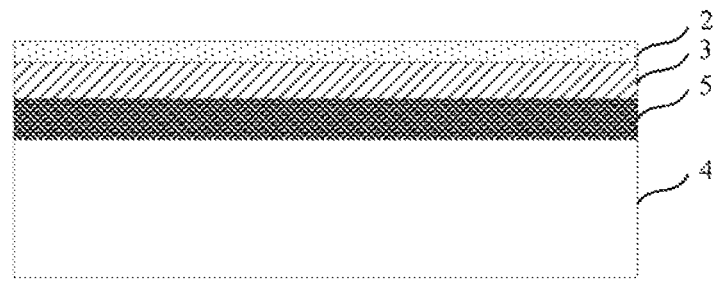
FIG. 5 is a schematic diagram showing that a residual doped single crystal film exists on an ultra-thin material on insulator in Step 4 of a method for preparing an ultra-thin material on insulator through adsorption by a doped ultra-thin layer according to Embodiment 1 of the present invention.
Figure 6:
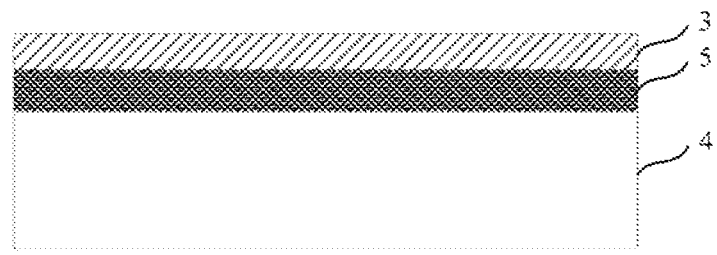
FIG. 6 is a schematic diagram of an ultra-thin material on insulator in Step 4 of a method for preparing an ultra-thin material on insulator through adsorption by a doped ultra-thin layer according to Embodiment 1 of the present invention.

Step 4: Referring to FIG. 5 and FIG. 6 and as shown in the figures, perform chemical corrosion or chemical-mechanical polishing, and remove the residual doped single crystal film 2, so as to obtain an ultra-thin material on insulator. In this embodiment, a removing method is preferably a selective chemical corrosion method.

In another implementation manner, in Step 1, a step of epitaxially growing a buffer layer (not shown) on the single-layer doped single crystal film 2 is further included; and in Step 4, a step of removing a residual buffer layer and doped single crystal film is further included. The existence of the buffer layer is capable of avoiding that the ion-cut crack affects the quality of a crystal of the material on insulator. Specifically, a material of the buffer layer is selected from any one of Si, Ge, SiGe, SiGeC, GaAs, AlGaAs, InGaP, and InP, where a constituent of Ge in SiGe is adjustable; and the thickness of the buffer layer does not exceed a critical thickness of the buffer layer growing on the single-layer doped single crystal film 2. In this embodiment, the buffer layer is preferably made of a SiGe single crystal material.

In the preparation of the material on insulator according to the present invention, the doped ultra-thin single crystal film can more effectively adsorb the implanted ion, so that the ion implantation dose can be lowered; the micro crack is formed at a lower annealing temperature so as to implement the ion-cut, and an obtained material on insulator has a lower surface roughness and fewer defects, thereby implementing the preparation of a higher-quality ultra-thin material on insulator at lower cost.

Embodiment 2

Embodiment 2 and Embodiment 1 adopt basically the same technical solution, and the difference lies in that structures of doped single crystal films prepared in the two embodiments are different. In Embodiment 1, the doped single crystal film is single-layer; while in this embodiment, a doped single crystal film is multi-layer.

Figure 7:
FIG. 7 is a schematic structural diagram presented in Step 1 of a method for preparing an ultra-thin material on insulator through adsorption by a doped ultra-thin layer according to Embodiment 2 of the present invention.

Referring to FIG. 7 to FIG. 11, the present invention provides a method for preparing an ultra-thin material on insulator through adsorption by a doped ultra-thin layer, where the method includes at least the following steps:

Step 1: Referring to FIG. 7 and as shown in the figure, provide a first substrate 1, adopt a chemical vapor deposition method, a physical vapor deposition method, or a molecular beam epitaxy method to successively and epitaxially grow a multi-layer doped single crystal film 2 and a top film 3 on the first substrate 1. Specifically, the multi-layer doped single crystal film 2 is formed by multiple superposed bi-layer films, where a material of the bi-layer films is selected from any one of Si/Ge, Si/SiGe, Ge/SiGe, Ge/GaAs, GaAs/AlGaAs, and InP/InGa; a constituent of Ge in SiGe is adjustable; and in this embodiment, a multi-layer doped single crystal film formed by superposed Si/SiGe bi-layer films is taken as an example for illustration. First, a Si layer 211 is epitaxially grown on the first substrate 1, then a $Si_{1-x}Ge_x$ layer 212 in which the value of a Ge constituent x is x1 is epitaxially grown on the Si layer 211 to form a $Si/Si_{1-x}Ge_x$ bi-layer film 21, where $0<x\le 1$; and then according to the same manner as that of preparing the $Si/Si_{1-x}Ge_x$ bi-layer film 21, multiple $Si/Si_{1-x}Ge_x$ bi-layer films in which the values of the Ge constituent x are the same or different (that is, any two values among values of x1, x2, x3, . . . xn may be equal or unequal) are prepared on the $Si/Si_{1-x}Ge_x$ bi-layer film 21. At the same time, doped gas is introduced when multiple $Si/Si_{1-x}Ge_x$ bi-layer films are prepared, and then the multi-layer doped single crystal film 2 formed by n superposed $Si/Si_{1-x}Ge_x$ bi-layer films is obtained on the first substrate 1, where n ranges from 3 to 10, and the total thickness of the multi-layer doped single crystal film 2 is less than 10 nm. In this embodiment, preferably, n=4, that is, the multi-layer doped single crystal film 2 includes the $Si/Si_{1-x}Ge_x$ bi-layer films 21, 22, 23, and 24.

Figure 8:
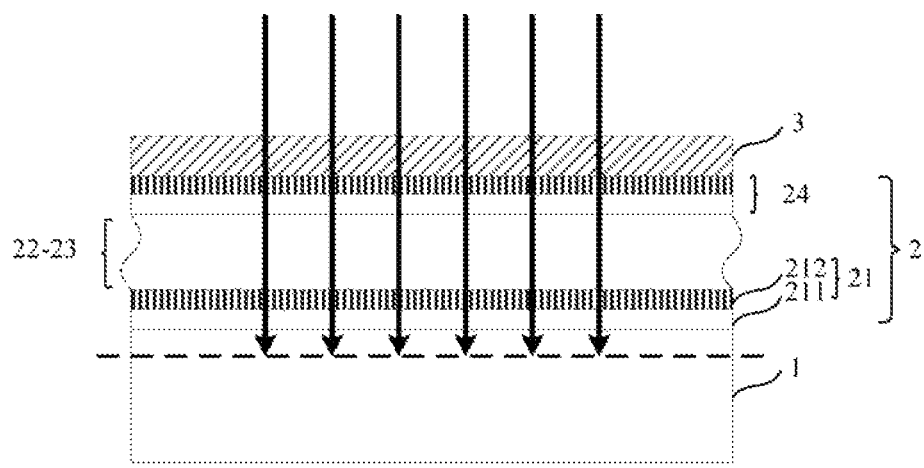
FIG. 8 is a schematic diagram showing ion implantation in a method for preparing an ultra-thin material on insulator through adsorption by a doped ultra-thin layer according to Embodiment 2 of the present invention.
Figure 9:
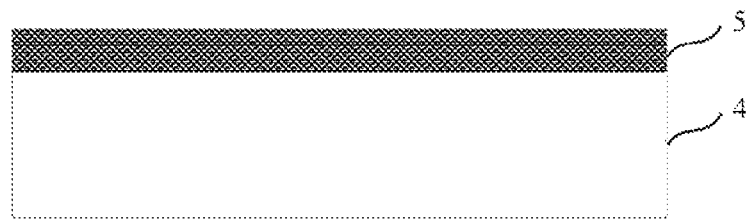
FIG. 9 is a schematic diagram of a second substrate having an insulating layer in a method for preparing an ultra-thin material on insulator through adsorption by a doped ultra-thin layer according to Embodiment 2 of the present invention.
Figure 10:
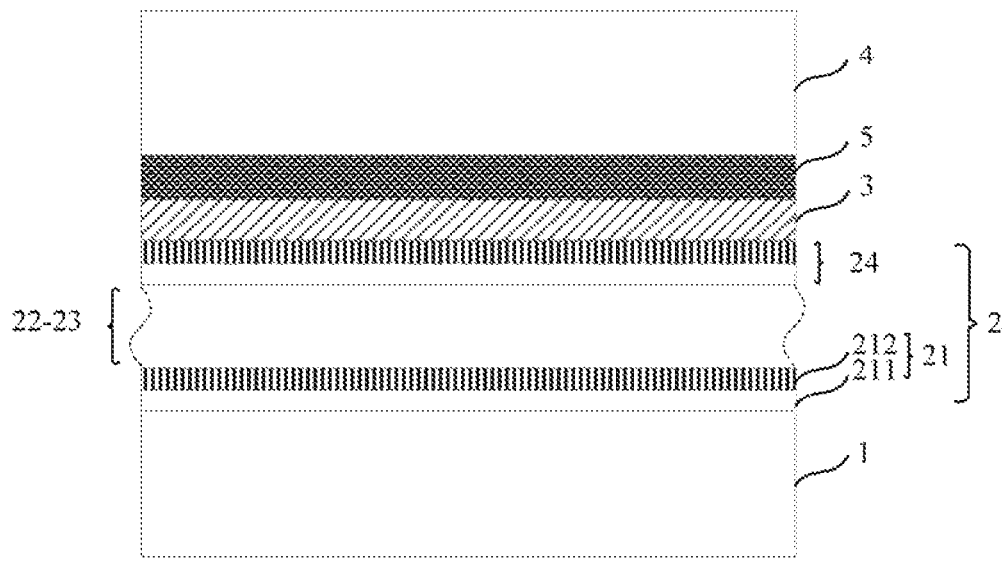
FIG. 10 is a schematic structural diagram presented after bonding in a method for preparing an ultra-thin material on insulator through adsorption by a doped ultra-thin layer according to Embodiment 2 of the present invention.
Figure 11:
FIG. 11 is a schematic diagram of an ultra-thin material on insulator in a method for preparing an ultra-thin material on insulator through adsorption by a doped ultra-thin layer according to Embodiment 2 of the present invention.

After Step 1 is finished, referring to FIG. 8 and FIG. 11 and as shown in the figures, steps basically the same as Step 2, Step 3, and Step 4 in Embodiment 1 are performed to obtain an ultra-thin material on insulator.

In another implementation manner, in Step 1, a step of epitaxially growing a buffer layer (not shown) on the multi-layer doped single crystal film 2 is further included; and in Step 4, a step of removing a residual buffer layer and doped single crystal film is further included. The existence of the buffer layer is capable of avoiding that the ion-cut crack affects the quality of a crystal of the material on insulator. Specifically, a material of the buffer layer is selected from any one of Si, Ge, SiGe, SiGeC, GaAs, AlGaAs, InGaP, and InP, where a constituent of Ge in SiGe is adjustable; and the thickness of the buffer layer does not exceed a critical thickness of the buffer layer growing on the multi-layer doped single crystal film 2. In this embodiment, the buffer layer is preferably made of a SiGe single crystal material.

In the preparation of the material on insulator according to the present invention, the doped ultra-thin single crystal film can more effectively adsorb the implanted ion, so that the ion implantation dose is lowered; the micro crack is formed at a lower annealing temperature so as to implement the ion-cut; the obtained material on insulator has a lower surface roughness and fewer defects; and the multi-layer doped single crystal film is more advantageous to adsorb the implanted ion than the single-layer doped single crystal film.

To sum up, in the method for preparing the ultra-thin material on insulator through the adsorption by the doped ultra-thin layer of the present invention, the ultra-thin doped single crystal film adsorbs the implanted ion, and the micro crack is then formed, so as to implement the ion-cut; the ion-cut crack emerges on the ultra-thin layer, and the crack is rather small; therefore, the roughness of a surface of a ion-cut material on insulator is small; the ion is effectively adsorbed by the ultra-thin layer and the distribution is more even, so that an obtained material on insulator or a modified material on insulator has fewer defects; in addition, the impurity strengthens an ion adsorption capability of the ultra-thin single crystal film, so that the ion implantation dose can be lowered, and the annealing temperature of the ion-cut can also be lowered, thereby effectively reducing the damage to the top film, so that the obtained material on insulator has a higher quality and the cost is reduced at the same time. Therefore, the present invention effectively overcomes various defects in the prior art and has a high industrial utilization value.

The above embodiments are only to exemplarily illustrate the principles and efficacy of the present invention and are not intended to limit the present invention. Persons skilled in the art can make modifications or changes to the above embodiments without departing from the spirit and scope of the present invention. Therefore, any equivalent modifications or changes made by persons of common knowledge in the art without departing from the spirit and technical thoughts disclosed in the present invention shall still fall within the scope of the claims of the present invention.

What is claimed is:

1. A method for preparing an ultra-thin material on insulator through adsorption by a doped ultra-thin layer, comprising the following steps:
    a) providing a first substrate, and successively and epitaxially growing a doped single crystal film and a top film on the first substrate, a step of epitaxially growing a buffer layer on the doped single crystal film is further comprised;
    b) performing ion implantation, and making the ion implanted into a preset depth under an interface between the doped single crystal film and a silicon substrate, a step of removing a residual buffer and doped single crystal film is further comprised;
    c) providing a second substrate having an insulating layer, bonding the insulating layer and the top film, and then performing a first annealing stage on a sample to make the doped single crystal film adsorb the ion and form a micro crack, so as to implement ion-cut; and
    d) performing chemical corrosion or chemical-mechanical polishing, and removing the residual doped single crystal film, so as to obtain an ultra-thin material on insulator.

2. The method for preparing an ultra-thin material on insulator through adsorption by a doped ultra-thin layer as in claim 1, wherein a material of the buffer layer is selected from any one of Si, Ge, SiGe, SiGeC, GaAs, AlGaAs, InGaP, and InP.

3. The method for preparing an ultra-thin material on insulator through adsorption by a doped ultra-thin layer as in claim 1, wherein the thickness of the buffer layer does not exceed a critical thickness of the buffer layer growing on the doped single crystal film.

4. The method for preparing an ultra-thin material on insulator through adsorption by a doped ultra-thin layer as in claim 1, wherein in Step a), the doped single crystal film is a single-layer film, a material of the single-layer film is selected from any one of Si, Ge, SiGe, SiGeC, GaAs, AlGaAs, InGaP, and InP, and doped gas is introduced at the same time when the single-layer film is grown, so as to form a single-layer doped single crystal film.

5. The method for preparing an ultra-thin material on insulator through adsorption by a doped ultra-thin layer as in claim 4, wherein a thickness of the single-layer doped single crystal film ranges from 3 nm to 10 nm.

6. The method for preparing an ultra-thin material on insulator through adsorption by a doped ultra-thin layer as in claim 1, wherein in Step a), the doped single crystal film is a multi-layer film, the multi-layer film is formed by multiple superposed bi-layer films, a material of the bi-layer films is selected from any one of Si/Ge, Si/SiGe, Ge/SiGe, Ge/GaAs, GaAs/AlGaAs, and InP/InGa, and doped gas is introduced at the same time when the multi-layer film is grown, so as to form a multi-layer doped single crystal film.

7. The method for preparing an ultra-thin material on insulator through adsorption by a doped ultra-thin layer as in claim 6, wherein the total thickness of the multi-layer doped single crystal film is less than 10 nm.

8. The method for preparing an ultra-thin material on insulator through adsorption by a doped ultra-thin layer as in claim 1, wherein in the doped single crystal film, an impurity element is B, P, Ga, As, Sb, In, or C.

9. The method for preparing an ultra-thin material on insulator through adsorption by a doped ultra-thin layer as in claim 1, wherein in the doped single crystal film, the concentration of the impurity element ranges from $1E19$ $cm^{-3}$ to $1E22$ $cm^{-3}$.

10. The method for preparing an ultra-thin material on insulator through adsorption by a doped ultra-thin layer as in claim 1, wherein a material of the top film is selected from any one of Si, Ge, SiGe, SiGeC, GaAs, AlGaAs, InGaP, and InP.

11. The method for preparing an ultra-thin material on insulator through adsorption by a doped ultra-thin layer as in claim 1, wherein a thickness of the top film ranges from 5 nm to 50 nm.

12. The method for preparing an ultra-thin material on insulator through adsorption by a doped ultra-thin layer as in claim 1, wherein in Step b), an H ion is implanted, or an H ion and a He ion are implanted together.

13. The method for preparing an ultra-thin material on insulator through adsorption by a doped ultra-thin layer as in claim 1, wherein in Step b), an ion implantation dose ranges from $3E16$ $cm^{-2}$ to $6E16$ $cm^{-2}$.

14. The method for preparing an ultra-thin material on insulator through adsorption by a doped ultra-thin layer as in claim 1, wherein in Step b), the preset depth ranges from 30 nm to 120 nm.

15. The method for preparing an ultra-thin material on insulator through adsorption by a doped ultra-thin layer as in claim 1, wherein in Step c), the bonding adopts a plasma enhanced bonding method.

16. The method for preparing an ultra-thin material on insulator through adsorption by a doped ultra-thin layer as in claim 1, wherein in Step c), the bonding adopts a direct bonding method, and a step of performing a second annealing stage after the ion-cut implemented in the first annealing stage is further comprised, so as to strengthen the bonding of the insulating layer and the top film.

* * * * *